(12) United States Patent
Kim et al.

(10) Patent No.: US 9,721,904 B2
(45) Date of Patent: Aug. 1, 2017

(54) SEMICONDUCTOR PACKAGES INCLUDING A SHIELDING PART AND METHODS FOR MANUFACTURING THE SAME

(71) Applicant: SK hynix Inc., Icheon-si Gyeonggi-do (KR)

(72) Inventors: Seung Ho Kim, Icheon-si (KR); Soo Won Kang, Seoul (KR); Jung Tae Jeong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/079,337

(22) Filed: Mar. 24, 2016

(65) Prior Publication Data

US 2017/0162515 A1   Jun. 8, 2017

(30) Foreign Application Priority Data

Dec. 4, 2015  (KR) ......................... 10-2015-0172152

(51) Int. Cl.
*H01L 23/552* (2006.01)
*H01L 23/498* (2006.01)
(Continued)

(52) U.S. Cl.
CPC ........ *H01L 23/552* (2013.01); *H01L 21/4853* (2013.01); *H01L 23/3128* (2013.01); *H01L 23/4985* (2013.01); *H01L 23/49838* (2013.01); *H01L 23/585* (2013.01); *H01L 25/0657* (2013.01); *H01L 29/49* (2013.01); *H01L 2224/48091* (2013.01);
(Continued)

(58) Field of Classification Search
CPC .............. H01L 23/552; H01L 23/4985; H01L 23/3128; H01L 23/49838; H01L 23/585; H01L 25/1756; H01L 25/117; H01L 25/04–25/0756; H01L 2225/0652; H01L 2225/06572; H01L 2225/0651; H01L 2225/06537; H01L 2224/48091; H01L 2224/48227; H01L 2224/48106; H01L 2924/1431; H01L 2924/1434; H01L 2924/1433; H01L 2924/3025
See application file for complete search history.

(56) References Cited

U.S. PATENT DOCUMENTS

| | | | |
|---|---|---|---|
| 4,838,475 A * | 6/1989 | Mullins ................. | H05K 3/341 174/361 |
| 6,781,851 B2 * | 8/2004 | Daoud ................. | H05K 9/0026 361/800 |

(Continued)

*Primary Examiner* — Michael Trinh
(74) *Attorney, Agent, or Firm* — William Park & Associates Ltd.

(57) ABSTRACT

A method for manufacturing a semiconductor package and the semiconductor package are provided. The method for manufacturing a semiconductor package may include arranging a conductive elastic plate over a package substrate including through slits disposed along edges of a chip mounting region and a conductive guard rails providing a concave trench shape, and bending the conductive elastic plate. Edge portions of the conductive elastic plate may be inserted into the trenches of the conductive guard rails and supported by the conductive guard rails by a force trying to stretch by the elastic restoring force of the wing portions of the conductive elastic plate.

18 Claims, 16 Drawing Sheets

(51) Int. Cl.
*H01L 23/58* (2006.01)
*H01L 23/31* (2006.01)
*H01L 29/49* (2006.01)
*H01L 21/48* (2006.01)
*H01L 25/065* (2006.01)

(52) U.S. Cl.
CPC ........... *H01L 2224/48106* (2013.01); *H01L 2224/48227* (2013.01); *H01L 2225/0651* (2013.01); *H01L 2225/0652* (2013.01); *H01L 2225/06572* (2013.01); *H01L 2924/1431* (2013.01); *H01L 2924/1433* (2013.01); *H01L 2924/1434* (2013.01); *H01L 2924/3025* (2013.01)

(56) References Cited

U.S. PATENT DOCUMENTS

| | | | | |
|---|---|---|---|---|
| 6,989,994 | B2* | 1/2006 | Maguire | H05K 1/0215 |
| | | | | 174/377 |
| 7,109,410 | B2 | 9/2006 | Arnold et al. | |
| 7,145,084 | B1* | 12/2006 | Sarihan | H01L 23/041 |
| | | | | 174/361 |
| 7,183,498 | B2* | 2/2007 | Ogura | H05K 9/0022 |
| | | | | 174/377 |
| 7,463,496 | B2* | 12/2008 | Robinson | H01L 23/552 |
| | | | | 361/816 |
| 2005/0248927 | A1* | 11/2005 | Mashimo | H05K 3/3405 |
| | | | | 361/816 |
| 2008/0043453 | A1* | 2/2008 | Horng | H05K 9/0028 |
| | | | | 361/818 |
| 2014/0312473 | A1* | 10/2014 | Chung | H01L 23/552 |
| | | | | 257/659 |
| 2015/0102473 | A1 | 4/2015 | Yu et al. | |

* cited by examiner

SEMICONDUCTOR PACKAGES INCLUDING A SHIELDING PART AND METHODS FOR MANUFACTURING THE SAME

CROSS-REFERENCE TO RELATED APPLICATION

The present application claims priority under 35 U.S.C. 119(a) to Korean Patent Application No. 10-2015-0172152, filed on Dec. 4, 2015, which is herein incorporated by reference in its entirety.

BACKGROUND

1. Technical Field

Various embodiments of the present disclosure generally relate to a packaging technology and, more particularly, to semiconductor packages including a shielding part and methods for manufacturing the same.

2. Related Art

Semiconductor chip or die including integrated circuits needs to be protected from electromagnetic field generating elements that can affect the operation of the integrated circuits. Also, in the electronic systems consisting of a number of semiconductor devices, the need to block or shield the electromagnetic wave or radio frequency wave which may be caused in the operation of the integrated circuits has been significantly recognized in order not to affect each other or in order not to affect the human body using the electronic systems. In addition, in the mobile devices or wearable devices used in close proximity to the human body, it has become very important to block electromagnetic interference (EMI) from influencing the human body. Accordingly, the ability to shield EMI in a semiconductor package level is required.

DETAILED DESCRIPTION

Figure 1:
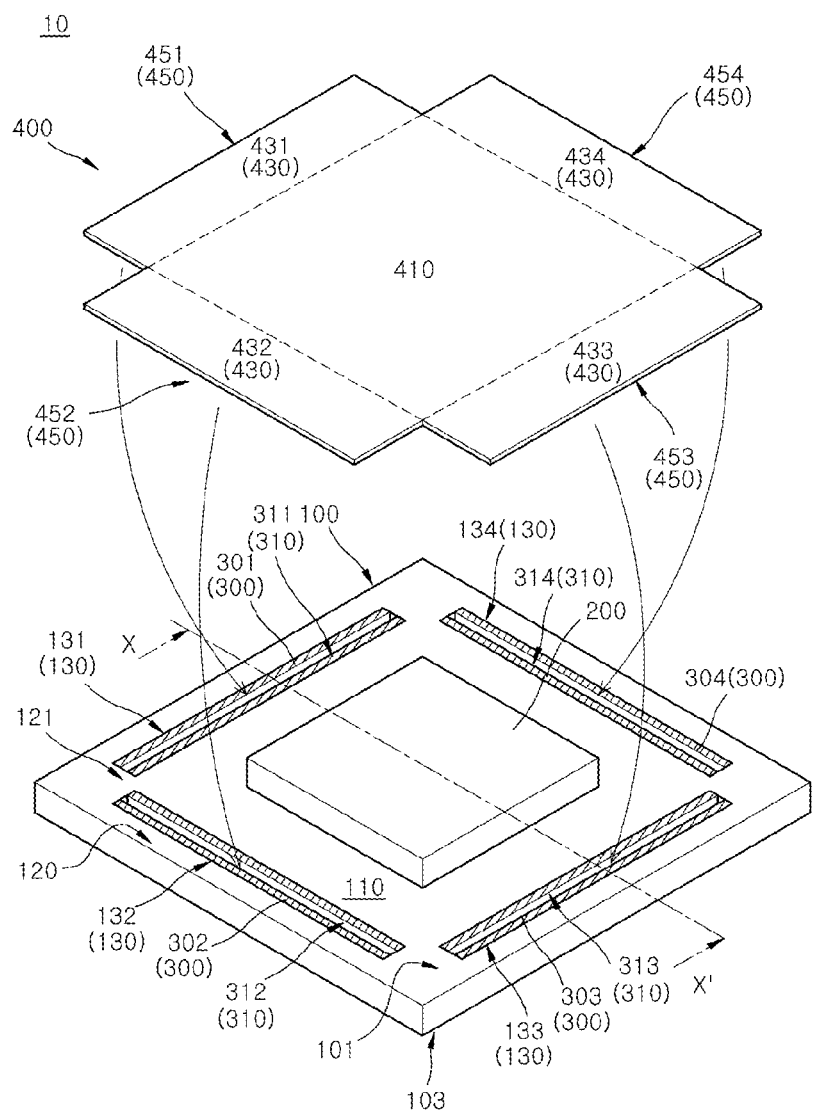
FIGS. 1 to 5 are schematic views illustrating representations of examples a semiconductor package and a method for manufacturing the same according to an embodiment.

According to an embodiment, a method for manufacturing a semiconductor package may include preparing a package substrate including a chip mounting region, through slits disposed along the edge of the chip mounting region, conductive guard rails disposed in the through slits and providing concave trenches, mounting a semiconductor chip on the chip mounting region, arranging a conductive elastic plate over the package substrate, and attaching the conductive elastic plate to the package substrate by bending the conductive elastic plate so that edge portions of the conductive elastic plate are inserted into the trenches of the conductive guard rails, the edge portions of the conductive elastic plate are supported to the guard rails by a force trying to stretch by an elastic restoring force of the conductive elastic plate.

According to an embodiment, a method for manufacturing a semiconductor package may include preparing a package substrate including a chip mounting region, through slits disposed along an edge of the chip mounting region, mounting a semiconductor chip on the chip mounting region, arranging a conductive elastic plate over a first surface of the package substrate, bending the conductive elastic plate so that edge portions of the conductive elastic plate are inserted into the through slits and the edge portions are protruded from a second surface opposite to the first surface of the package substrate, and attaching ground terminals to the second surface of the package substrate so that the edge portions of the conductive elastic plate protruded from the second surface of the package substrate are secured to the second surface of the package substrate.

According to an embodiment, a method for manufacturing a semiconductor package may include preparing a package substrate including a chip mounting region, through slits disposed along an edge of the chip mounting region, and conductive guard rails disposed in the through slits and providing concave trenches, mounting a semiconductor chip on the chip mounting region, arranging a conductive elastic plate having a cage shape over the package substrate, wing portions extended from a ceiling portion of the center, and bending the edge portions of the conductive elastic plate so that the edge portions of the wing portions of the conductive elastic plate are inserted into the trenches of the guard rails, the edge portions of the conductive elastic plate are supported by the guard rails by a force trying to stretch by an elastic restoring force of the conductive elastic plate.

According to an embodiment, a method for manufacturing a semiconductor package may include preparing a package substrate including a chip mounting region and through slits disposed along an edge of the chip mounting region, mounting a semiconductor chip on the chip mounting region, arranging a conductive elastic plate having a cage shape over the package substrate, wing portions extended from a ceiling portion of the center, bending the edge portions of the conductive elastic plate so that the edge portions of the wing portions of the conductive elastic plate are inserted into the trenches of the guard rail and the edge portions of the wing portions are protruded from a second surface opposite to the first surface of the package substrate, and attaching ground terminals to a second surface of the package substrate so that the edge portions of the conductive elastic plate are secured to the second surface of the package substrate.

According to an embodiment, a semiconductor package may include a package substrate including a chip mounting region, through slits disposed along an edge of the chip mounting region, and conductive guard rails disposed in the through slits and providing concave trenches, a semiconductor chip mounted on the chip mounting region, and an EMI shielding cage including a conductive elastic plate including ceiling portion of the center and wing portions extended from the ceiling portion, the wing portions of the conductive elastic plate are elastically bent and form a cage shape having the semiconductor chip therein, and edge portions of the wing portions are inserted into the trenches of the conductive guard rails and supported by the conductive guard rails by a force trying to stretch by an elastic restoring force of the wing portions of the conductive elastic plat.

According to an embodiment, a semiconductor package may include a package substrate including a chip mounting region and through slits disposed along an edge of the chip mounting region, a semiconductor chip mounted on the chip mounting region, an EMI shielding cage including a conductive elastic plate including ceiling portion of the center and wing portions extended from the ceiling portion, and ground terminals securing and fixing the edge portions of the conductive elastic plate to the second surface of the package substrate, the wing portions of the conductive elastic plate are elastically bent and form a cage shape having the semiconductor chip therein, and the edge portions of the wing portions are inserted into the through slits and penetrating the package substrate and protruded from a second surface opposite to the first surface of the package substrate.

According to an embodiment, there is provided a memory card including a semiconductor package. The semiconductor package may include a package substrate including a chip mounting region, through slits disposed along an edge of the chip mounting region, and conductive guard rails disposed in the through slits and providing concave trenches, a semiconductor chip mounted on the chip mounting region, and an EMI shielding cage including a conductive elastic plate including ceiling portion of the center and wing portions extended from the ceiling portion, the wing portions of the conductive elastic plate are elastically bent and form a cage shape having the semiconductor chip therein, and edge portions of the wing portions are inserted into the trenches of the conductive guard rails and supported by the conductive guard rails by a force trying to stretch by an elastic restoring force of the wing portions of the conductive elastic plate.

According to an embodiment, there is provided a memory card including a semiconductor package. The semiconductor package may include a package substrate including a chip mounting region and through slits disposed along an edge of the chip mounting region, a semiconductor chip mounted on the chip mounting region, an EMI shielding cage including a conductive elastic plate including ceiling portion of the center and wing portions extended from the ceiling portion, and ground terminals securing and fixing the edge portions of the conductive elastic plate to the second surface of the package substrate, the wing portions of the conductive elastic plate are elastically bent and form a cage shape having the semiconductor chip therein, and the edge portions of the wing portions are inserted into the through slits and penetrating the package substrate and protruded from a second surface opposite to the first surface of the package substrate.

According to an embodiment, there is provided an electronic system including a semiconductor package. The semiconductor package may include a package substrate including a chip mounting region, through slits disposed along an edge of the chip mounting region, and conductive guard rails disposed in the through slits and providing concave trenches, a semiconductor chip mounted on the chip mounting region, and an EMI shielding cage including a conductive elastic plate including ceiling portion of the center and wing portions extended from the ceiling portion, the wing portions of the conductive elastic plate are elastically bent and form a cage shape having the semiconductor chip therein, and edge portions of the wing portions are inserted into the trenches of the conductive guard rails and supported by the conductive guard rails by a force trying to stretch by an elastic restoring force of the wing portions of the conductive elastic plate.

According to an embodiment, there is provided an electronic system including a semiconductor package. The semiconductor package may include a package substrate including a chip mounting region and through slits disposed along an edge of the chip mounting region, a semiconductor chip mounted on the chip mounting region, an EMI shielding cage including a conductive elastic plate including ceiling portion of the center and wing portions extended from the ceiling portion, and ground terminals securing and fixing the edge portions of the conductive elastic plate to the second surface of the package substrate, the wing portions of the conductive elastic plate are elastically bent and form a cage shape having the semiconductor chip therein, and the edge portions of the wing portions are inserted into the through slits and penetrating the package substrate and protruded from a second surface opposite to the first surface of the package substrate.

According to an embodiment, there is provided a semiconductor package. The semiconductor package may include a package substrate including a chip mounting region, at least two trenches along at least two edges of the chip mounting region. The semiconductor package may include a conductive elastic plate including a ceiling portion and at least two edge portions extending from the ceiling portion. The at least two edge portions may be inserted into the trenches.

The terms used in the description of the embodiments correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. In the following description of the embodiments, it will be understood that the terms "first" and "second", "top" and "bottom or lower" are intended to identify the member, but not used to define only the member itself or to mean a particular sequence.

The semiconductor package may include electronic devices such as a semiconductor die or chip, and the semiconductor die or chip may include a cut or processed form of a die or chip from a semiconductor substrate in which electronic circuits are integrated. The semiconductor chip may be a memory chip in which memory integrated circuits such as dynamic random access memory (DRAM)

devices, static random access memory (SRAM) devices, flash memory devices, magnetic random access memory (MRAM) devices, resistive random access memory (ReRAM) devices, ferroelectric random access memory (FeRAM) devices or phase changeable random access memory (PcRAM) devices. Alternatively, the semiconductor die or chip may be a logic die or an ASIC chip in which logic circuits are integrated on a semiconductor substrate.

The package substrate is a substrate for electrically connecting the semiconductor chip to other devices of the outside, and the package substrate may include circuit traces in a substrate body of a dielectric material layer unlike the semiconductor substrate. The package substrate may have a form of a printed circuit board (PCB). The semiconductor package may be applied to information communication devices such as mobile devices, bio or health care associated electronic devices, and wearable electronic devices to the human body.

The same reference numerals refer to the same elements throughout the specification. Thus, even though a reference numeral is not mentioned or described with reference to a drawing, the reference numeral may be mentioned or described with reference to another drawing. In addition, even though the reference numerals are not illustrated in a drawing, it may be mentioned or described with reference to another drawing.

Figure 2:
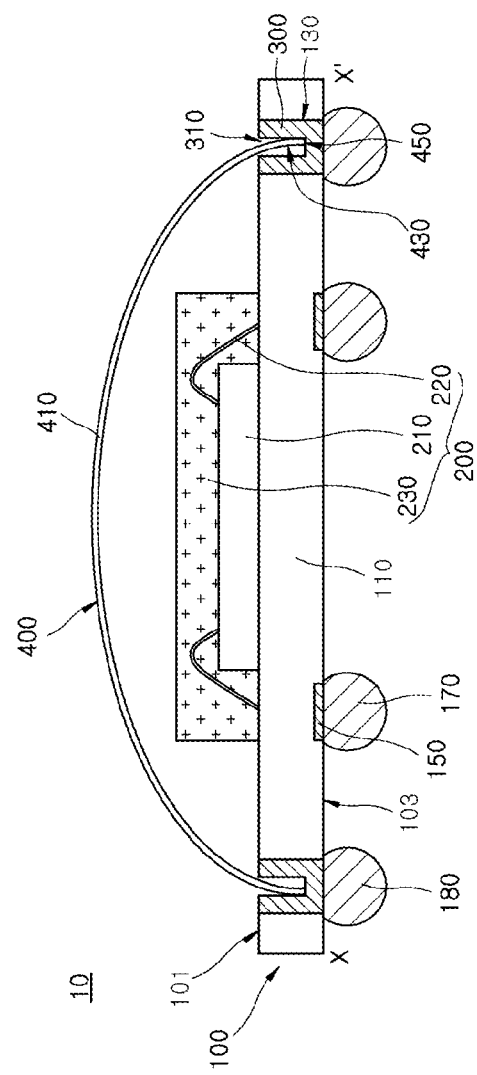
Figure 3:
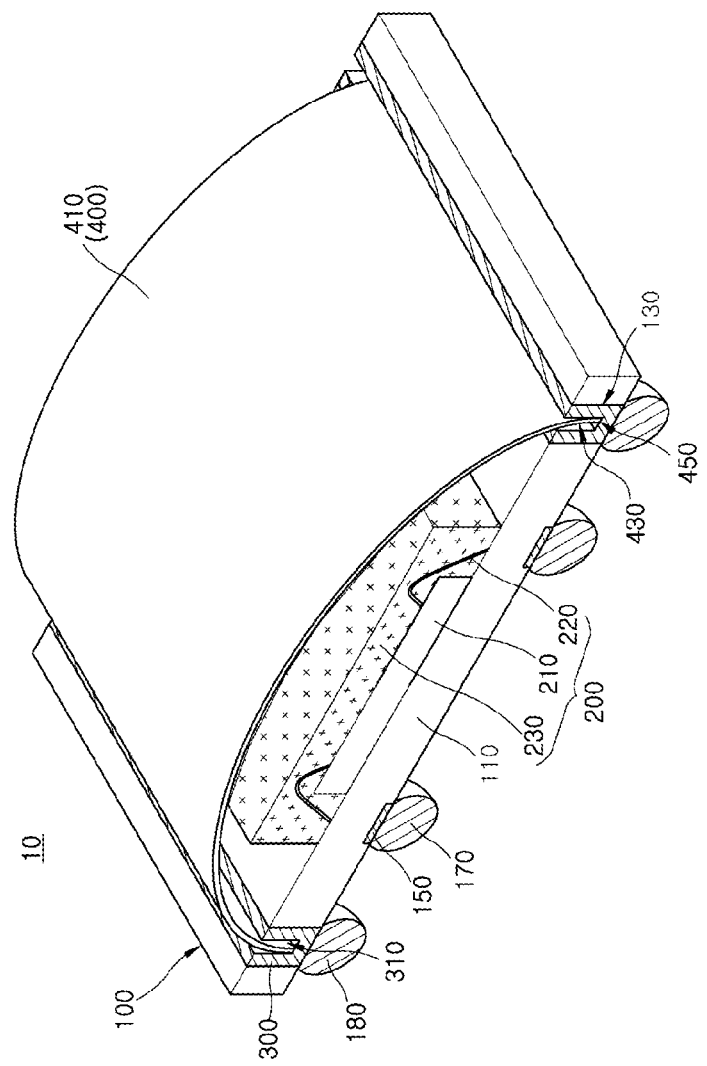
Figure 4:
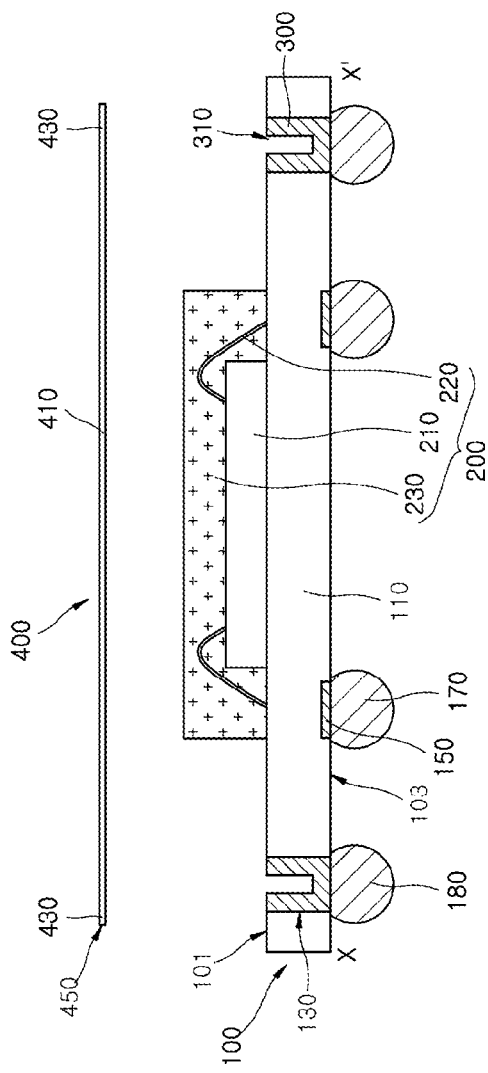
Figure 5:
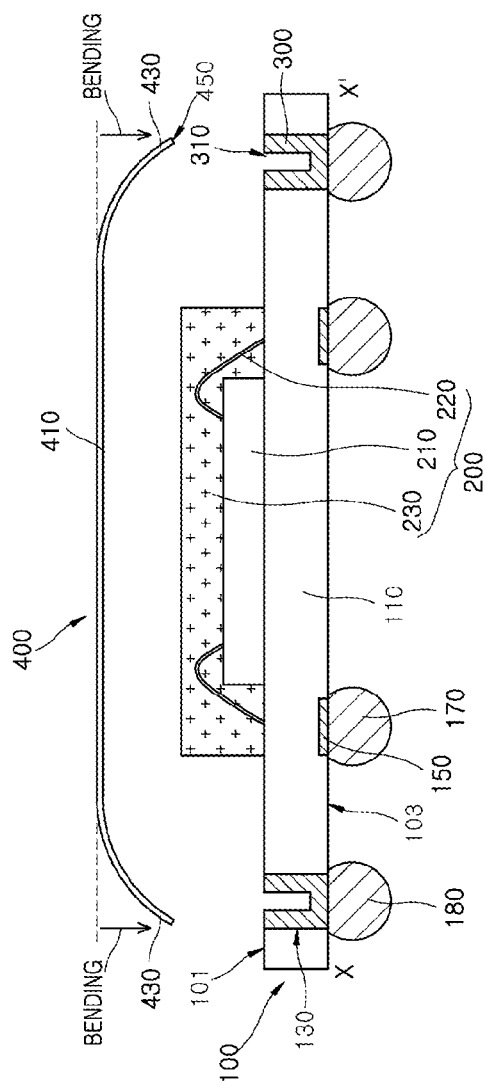

FIG. 1 is an exploded perspective view illustrating a semiconductor package 10 according to an embodiment. FIG. 2 is a cross-sectional view taken along line X-X' of FIG. 1. FIG. 3 is a partial cross-sectional view taken along line X-X' of FIG. 1. FIGS. 4 and 5 are cross-sectional views taken along line X-X' of FIG. 1 illustrating a method for manufacturing a semiconductor package 10 according to an embodiment.

Referring to FIGS. 1 and 2, the semiconductor package 10 includes a package substrate 100, a semiconductor device 200 mounted on the package substrate 100, and a conductive elastic plate 400 forming an EMI shielding cage. The package substrate 100 may be provided to electrically connect the semiconductor device 200 to other devices outside the semiconductor device 200. The package substrate 100 may include trace patterns as a circuit wiring structure for electrical interconnection in a dielectric body. The package substrate 100 may include a PCB.

The package substrate 100 includes a chip mounting region 110 in which the semiconductor device 200 is to be mounted, and may be a square plate including an outer edge region 120 disposed at a periphery of the chip mounting region 110. The package substrate 100 includes through slits 130 disposed along the edge of the chip mounting region 110. The through slits 130 may be disposed in a border area of the outer edge region 120 and the chip mounting region 110, and each of the through slits 130 may be formed in a hole shape penetrating the body of the package substrate 100 in the vertical direction or a trench shape.

The through slits 130 include a first through slit 131, a second through slit 132, a third through slit 133 and a fourth through slit 134 that are disposed at four sides of the chip mounting region 110 which can be set in a square region. For example, a frame region 121 connecting the chip mounting region 110 to the outer edge region 120 may be disposed between the first through slit 131 and the second through slit 132. In some cases, the first through slit 131, the second through slit 132, the third through slit 133 and the fourth through slit 134 may be connected to each other and may configure a through slit 130 forming a closed loop. In some cases, the through slits 130 may be divided into more numbers and may form arrays to surround the chip mounting region 110.

Conductive guard rails 300 are disposed in the through slits 130. The conductive guard rail 300 may be formed by forming a metal layer, such as a copper (Cu) layer, to fill the through slit 130. Each of the conductive guard rail 300 may provide a concave trench 310 shape or a long groove shape having an inlet opened to a first surface 101 of the package substrate 100. Since each of the conductive guard rail 300 is elongated along the extension direction of the through slit 130, the concave trench 310 may also be elongated. Although the concave trench 310 may have a bottom closed shape, as illustrated in FIG. 2, in some cases, it may be formed in a slit shape which penetrates the package substrate 100.

The conductive guard rails 300 are disposed in the through slits 130. The inlet of the concave trench 130 is opened to the first surface 101 of the package substrate 100, and the bottom of the concave trench 130 may be exposed to a second surface 103 opposite to the first surface 101 of the package substrate 100. Ground terminals 180 are connected to the portions of the conductive guard rails 300, which are exposed to the second surface 103 of the package substrate 100. Each of the ground terminals 180 have a solder ball shape or a bump shape. The ground terminals 180 are connected to the conductive guard rails 300 and may connect the conductive guard rails 300 and the conductive elastic plate 400 to the ground. The conductive elastic plate 400 is to be electrically connected to the conductive guard rail 300. Trace patterns such as connecting pads 150 may be provided on the second surface 103 of the package substrate 100. Besides the ground terminal 180, connecting terminals 170 for exchanging signals or for supplying power to the semiconductor device 200 may be attached to the connecting pads 150. Since the conductive guard rails 300 penetrate the package substrate 100 and a part of the conductive guard rail 300 is exposed to the second surface 103 of the package substrate 100, other connecting pads on which the ground terminal 180 is to be landed can be omitted.

A first conductive guard rail 301 having a first trench 311 is provided in the first through slit 131, a second conductive guard rail 302 having a second trench 312 is provided in the second through slit 132, a third conductive guard rail 303 having a third trench 313 is provided in the third through slit 133, and a fourth conductive guard rail 304 having a fourth trench 314 is provided in the fourth through slit 134.

Referring to FIG. 1, the conductive elastic plate 400 is a member for shielding EMI and may include an elastic material having an elastic restoring force that stretches back to its original state when it is bent by an external force. The conductive elastic plate 400 may have a plate shape having a ceiling portion 410 of the center and wing portions 430 extending from the ceiling portion 410. The ceiling portion 410 may be set in a square area. A first wing portion 431, a second wing portion 432, a third wing portion 433 and a fourth wing portion 434 extend to the outside of the four sides of the square area, and edge portions 450, that is, a first edge portion 451, a second edge portion 452, a third edge portion 453 and a fourth edge portion 454 face to the outside. The edge portions 450 may be outer end portions of the wing portions 430. The ceiling portion 410 of the conductive elastic plate 400 may correspond to and be overlapped with the chip mounting region 110.

The wing portions 430 of the conductive elastic plate 400 are elastically bent, as illustrated in FIG. 2, and the edge portions 450 of the elastically bent wing portions 430 may be inserted into each the trenches of the conductive guard rails 300. The conductive elastic plate 400 has the elastic restoring force that stretches to original state from the bent state. The edge portions 450 inserted into the trenches 310 push the inner side walls of the trenches 310 by the elastic restoring force and may be maintained in the state contacting the inner side walls of the trenches 310. The elastic restoring force of the conductive elastic plate 400 may provide a force supporting the edge portions 450 of the inserted wing portions 430 to be supported and fixed in the trenches 310. Accordingly, the conductive elastic plate 400 may be fixed or attached to the package substrate 100 without additional separated adhesive members.

Referring to FIGS. 2 and 3, the bent conductive elastic plate 400 may form a cage shape including the semiconductor device 200 therein. Referring to FIG. 3, since the conductive guard rail 300 and the trench 310 have an elongated shape along the through slit 130 of the elongated shape and the edge portions 450 of the conductive elastic plate 400 are inserted into the trenches 310, the semiconductor device 200 may be shielded in the lateral direction as well as in the upper surface direction. In addition, the chip mounting region 110 of the package substrate 100 may also be shielded in the lateral direction. The bent conductive elastic plate 400 may configure an EMI shielding cage which shields the semiconductor device 200 and the chip mounting region 110 of the package substrate 100. The semiconductor device 200 disposed inside the bent conductive elastic plate 400, as illustrated in FIG. 2, includes a semiconductor chip 210, connecting members 220, such as bonding wires, electrically connecting the semiconductor chip 210 to the trace patterns (not illustrated) of the package substrate 100, and an encapsulant layer 230 protecting the semiconductor chip 210.

Next, a process for providing the EMI shielding cage using the conductive elastic plate 400 to the above-described semiconductor package 10 will be described with reference to FIGS. 4 and 5.

Referring to FIG. 4, the package substrate 100 including the chip mounting region 110, through slits 130, and conductive guard rails 300 is prepared. The semiconductor chip 210 is mounted on the package substrate 100, and the package substrate 100 and the semiconductor chip 210 are electrically connected to each other using the connecting members 220, such as bonding wires. An encapsulant layer 230 protecting the semiconductor chip 210 is formed by performing a molding process using an epoxy molding compound (EMC). The conductive elastic plate 400 may be arranged over the package substrate 100 so that the ceiling portion 410 is located over the semiconductor chip 210, as illustrated in FIG. 1.

Referring to FIG. 5 with FIGS. 2 and 3, the conductive elastic plate 400 is bent, therefore, the wing portions 430 face the first surface 101 of the package substrate 100. The edge portions 450 of the wing portions 430 of the conductive elastic plate 400 are inserted into the trenches 310 of the conductive guard rails 300, as illustrated in FIGS. 2 and 3. Then, the bent wing portions 430 try to be stretched by the elastic restoring force of the conductive elastic plate 400 and each of the edge portions 450 contacts the inner side wall of each of the trenches 310 and is supported. Accordingly, the conductive elastic plate 400 forms an EMI shielding cage and can be attached to the package substrate 100. The ground terminals 180 are attached to the conductive guard rails 300. The connecting terminals 170 are attached to the connecting pads 140 located on the second surface 103 of the package substrate 100.

Figure 6:
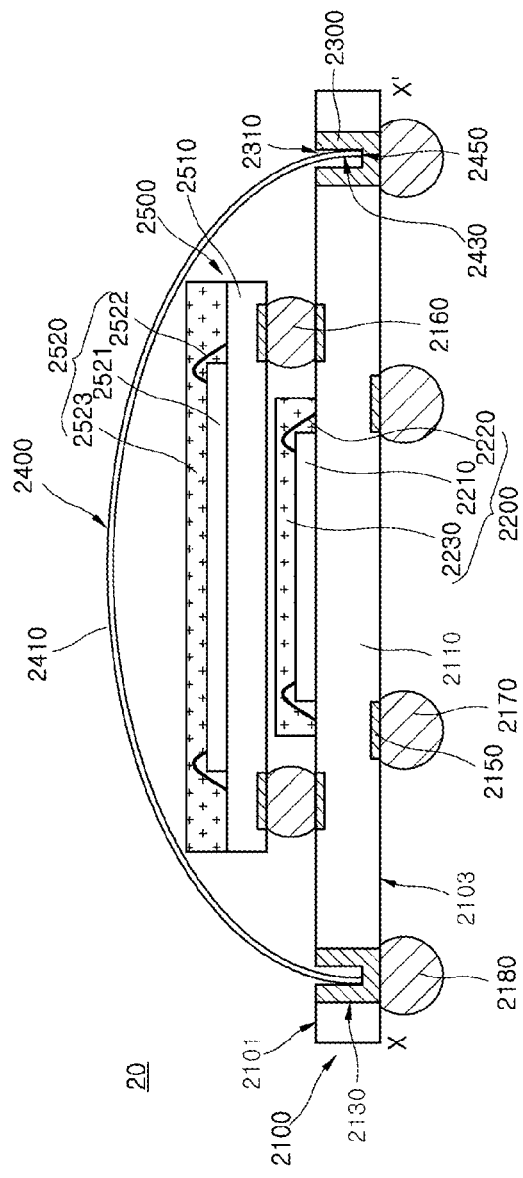
FIG. 6 is a cross-sectional view illustrating a representation of an example of a semiconductor package and a method for manufacturing the same according to an embodiment.

FIG. 6 is a cross-sectional view illustrating a semiconductor package 20 and a method for manufacturing the same according to an embodiment.

Referring to FIG. 6, the semiconductor package 20 may be configured as a package on package (POP) structure including a lower package substrate 2100, a lower semiconductor device 2200 and an upper semiconductor chip package 2500. The lower package substrate 2100 and the upper semiconductor chip package 2500 may be electrically connected to each other by substrate connecting members 2160. The substrate connecting member 2160 may include a conductive bump or a solder ball.

The lower package substrate 2100 may include a chip mounting region 2110, through slits 2130, and conductive guard rails 2300. The conductive guard rail 2300 may include a trench 2310 having an inlet opened to a first surface 2101 of the lower package substrate 2100 as an insert groove. The lower semiconductor device 2200 may be mounted on the lower package substrate 2100 by disposing a lower semiconductor chip 2210 on the first surface 2101 of the lower package substrate 2100 and forming first connecting members 2220 by a wire bonding process, and forming a first encapsulant layer 2230. Ground terminals 2180 are provided on a second surface 2103 of the lower package substrate 2100. Connecting terminals 2170 are attached to connecting pads 2150 disposed on the second surface 2103 of the lower package substrate 2100.

An upper semiconductor chip 2521 is mounted on the upper package substrate 2510 and second connecting members 2522 are formed by a wire bonding process, and a second encapsulant layer 2523 is formed, therefore, the upper semiconductor chip package 2500 in which the upper semiconductor device 2520 is mounted may be prepared. The POP structure may be formed by laminating the upper semiconductor chip package 2500 on the lower package substrate 2100.

A conductive elastic plate 2400 including a ceiling portion 2410 and wing portions 2430 is provided over the lower package substrate 2100, as illustrated in FIG. 1. The wing portions 2430 of the conductive elastic plate 2400 are elastically bent, and edge portions 2450 of the end portions of the wing portions 2430 can be inserted into the trenches 2310 and fixed. Then, the EMI shielding cage including the conductive elastic plate 2400 can be grounded by attaching the ground terminals 2180 to portions of the conductive guard rails 2300, which are exposed to the second surface 2103 of the lower package substrate 2100.

Figure 7:
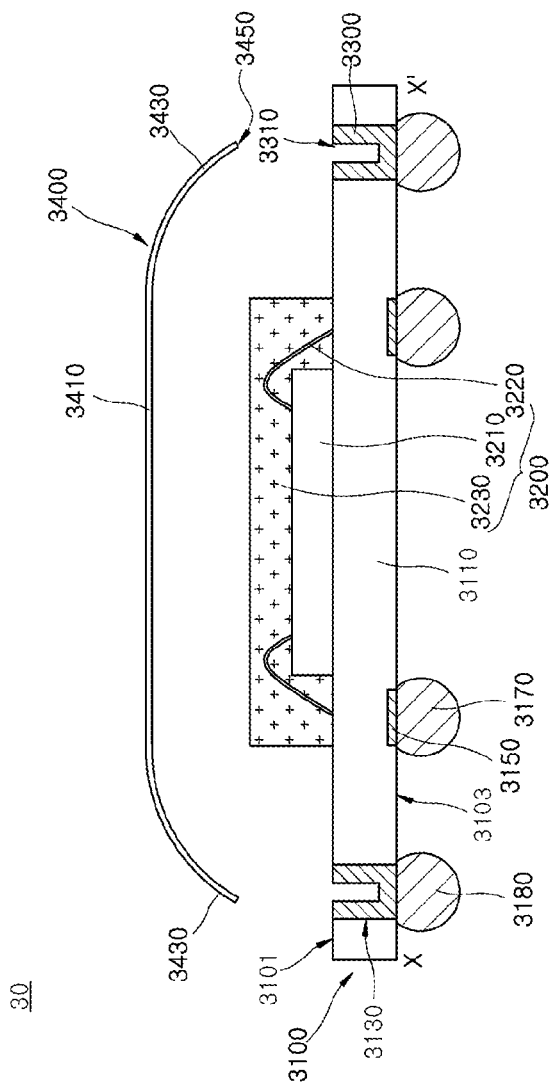
FIGS. 7 and 8 are cross-sectional views illustrating representations of examples of a semiconductor package and a method for manufacturing the same according to an embodiment.
Figure 8:
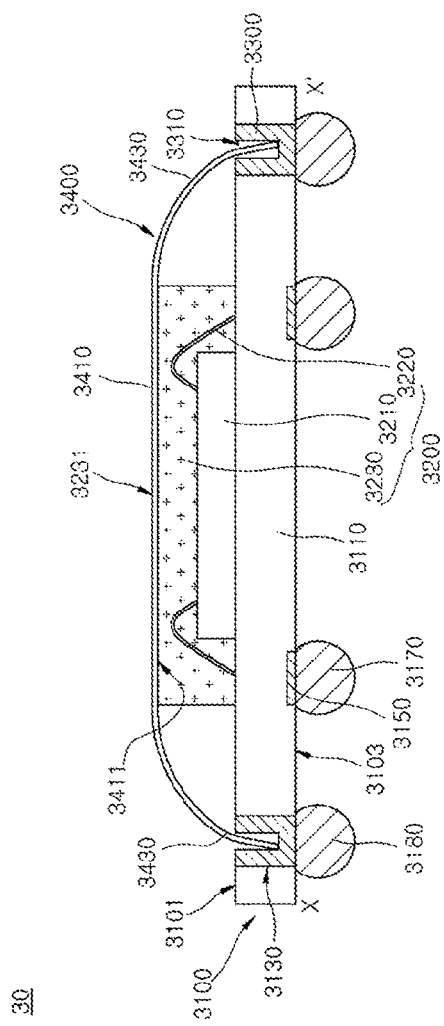

FIGS. 7 and 8 illustrate a semiconductor package 30 and a method for manufacturing the same according to an example of an embodiment.

Referring to FIG. 7, the semiconductor package 30 includes a package substrate 3100 and a conductive elastic plate 3400. The package substrate 3100 includes a chip mounting region 3110, through slits 3130, and conductive guard rails 3300. The conductive guard rail 3300 may include a trench 3310 having an inlet opened to a first surface 3101 of the package substrate 3100 as an insert groove. A semiconductor device 3200 may be mounted on the package substrate 3100 by disposing the semiconductor chip 3210 on the first surface 3101 of the package substrate 3100 and forming connecting members 3220 by a wire bonding process, and forming an encapsulant layer 3230 using a molding process. Connecting terminals 3170 are attached to connecting pads 3150 located on a second surface 3103 of the package substrate 3100.

The conductive elastic plate 3400 including a ceiling portion 3410 and wing portions 3430 may be provided over the package substrate 3100. The wing portions 3430 of the conductive elastic plate 3400 may extend to the outside from the ceiling portion 3410, like the conductive elastic plate 400 in FIG. 1. The wing portions 3430 of the conductive elastic plate 3400 may be pre-formed such that end edge portions 3450 of each of the wing portions 3430 are bent to face the first surface 3101 of the package substrate 3100. The conductive elastic plate 3400 may be pre-formed to have a cage shape that the wing portions 3430 are firstly bent.

Referring to FIG. 8, the pre-formed wing portions 3430 are elastically bent again, then, the edge portions 3450 of the wing portions 3430 can be inserted into the trenches 3310 of the conductive guard rails 3300 and fixed. Ground terminals 3180 are attached to portions of the conductive guard rails 3300 which are exposed to the second surface 3103 of the package substrate 3100, therefore, the EMI shielding cage formed by the conductive elastic plate 3400 may be grounded. Accordingly, the semiconductor package 30 using the pre-formed conductive elastic plate 3400 can be provided. A top surface 3231 of the encapsulant layer 3230 can closely contact a bottom surface 3411 of the ceiling portion 3410 of the conductive elastic plate 3400.

Figure 9:
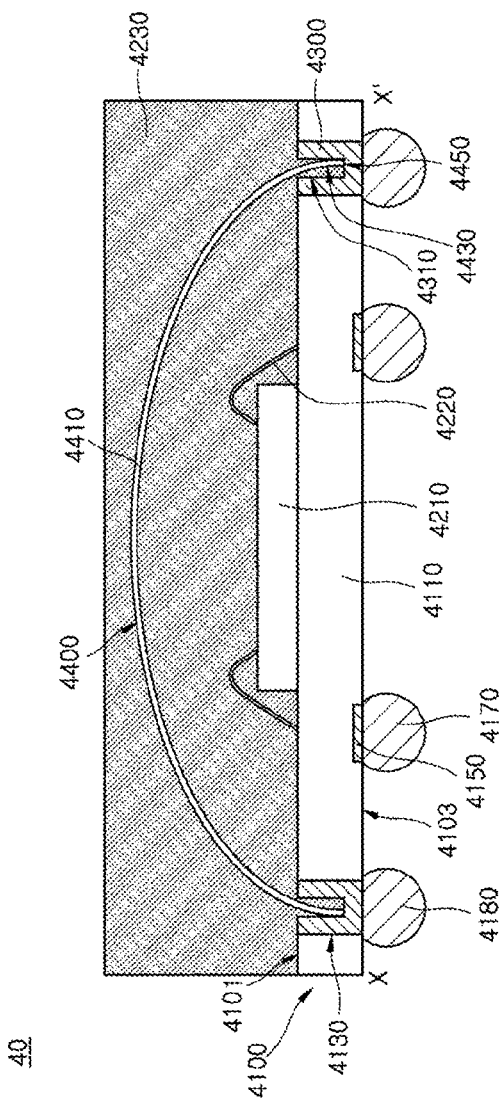
FIG. 9 is a cross-sectional view illustrating a representation of an example of a semiconductor package and a method for manufacturing the same according to an embodiment.

FIG. 9 illustrates a semiconductor package 40 and a method for manufacturing the same according to an embodiment.

Referring to FIG. 9, the semiconductor package 40 includes a package substrate 4100 and a conductive elastic plate 4400. The package substrate 4100 may include a chip mounting region 4110, through slits 4130, and conductive guard rails 4300. The conductive guard rail 4300 includes a trench 4310 having an inlet opened to a first surface 4101 of the package substrate 4100 as an insert groove. A semiconductor chip 4210 is mounted on the first surface 4101 of the package substrate 4100, and connecting members 4220 are formed using a wire bonding process. Ground terminals 4180 may be provided on a second surface 4103 of the package substrate 4100. Connecting terminals 4170 may be attached to connecting pads 4150 disposed on the second surface 4103 of the package substrate 4100.

Wing portions 4430 of the conductive elastic plate 4400 including a ceiling portion 4410 and the wing portions 4430 are bent, then, edge portions 4450 of the wing portions 4430 may be inserted into the trenches 4310 of the conductive guard rails 4300 and fixed. The conductive elastic plate 4400 is attached to the package substrate 4100, and an encapsulant layer 4230 is formed to cover the conductive elastic plate 4400 as well as the semiconductor chip 4210.

Figure 10:
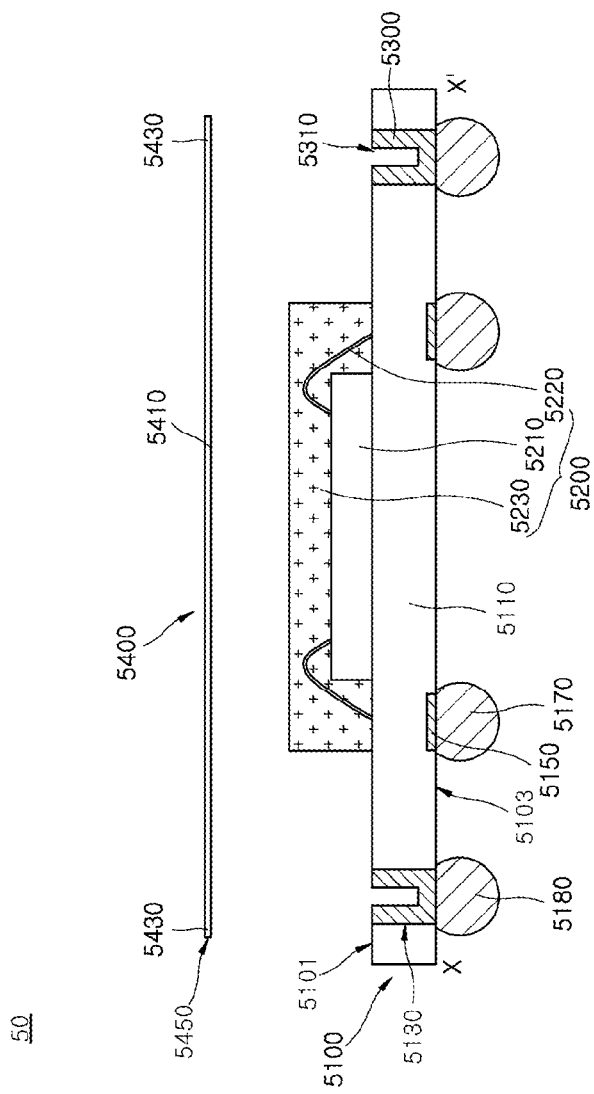
FIGS. 10 and 11 are cross-sectional views illustrating representations of examples of a semiconductor package and a method for manufacturing the same according to an embodiment.
Figure 11:
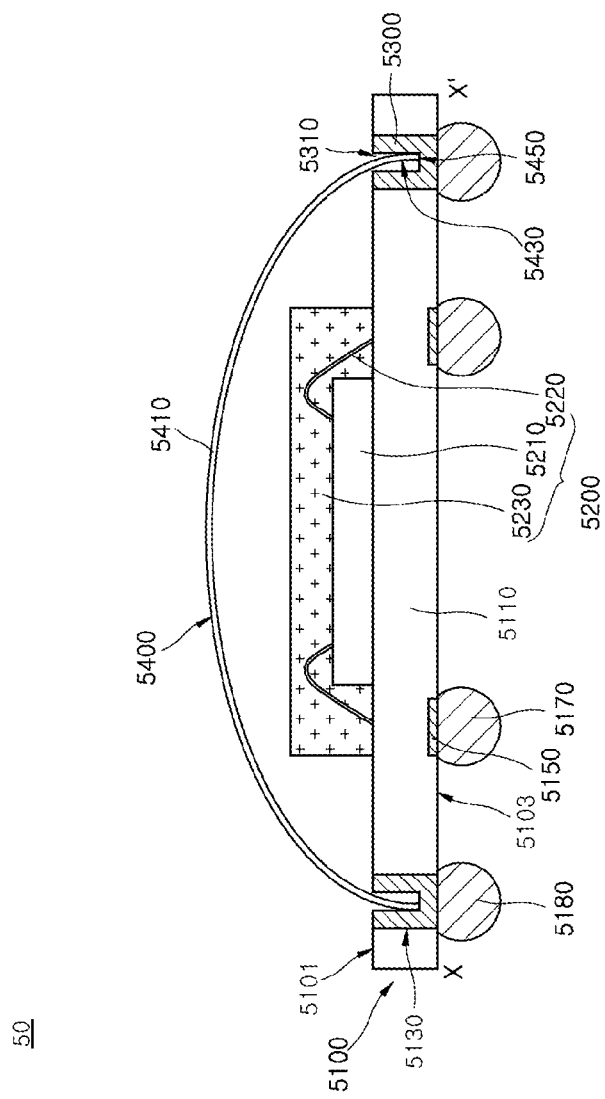

FIGS. 10 and 11 illustrate a semiconductor package 50 and a method for manufacturing the same according to an embodiment.

Referring to FIG. 10, the semiconductor package 50 includes a package substrate 5100 and a conductive elastic plate 5400. The package substrate 5100 may be a flexible substrate that can be bent. The package substrate 5100 includes a chip mounting region 5110, through slits 5130, and conductive guard rails 5300. The conductive guard rail 5300 may have trench 5310 having an inlet opened to a first surface 5101 of the package substrate 5100 as an insert groove. A semiconductor chip 5210 is mounted on the first surface 5101 of the package substrate 5100, and connecting members 5220 are formed using a wire bonding process. An encapsulant layer 5230 covering and protecting the semiconductor chip 5210 is formed using a flexible dielectric material.

Ground terminals 5180 are formed on a second surface 5103 of the package substrate 5100. Connecting terminals 5170 are attached to connecting pads 5150 disposed on the second surface 5103 of the package substrate 5100. The conductive elastic plate 5400 including a ceiling portion 5410 and wing portions 5430 is provided over the package substrate 5100 and, as illustrated in FIG. 11, the wing portions 5430 are bent and edge portions 5450 of the wing portions 5430 are inserted into the trenches 5310 of the conductive guard rails 5300 and fixed.

Figure 12:
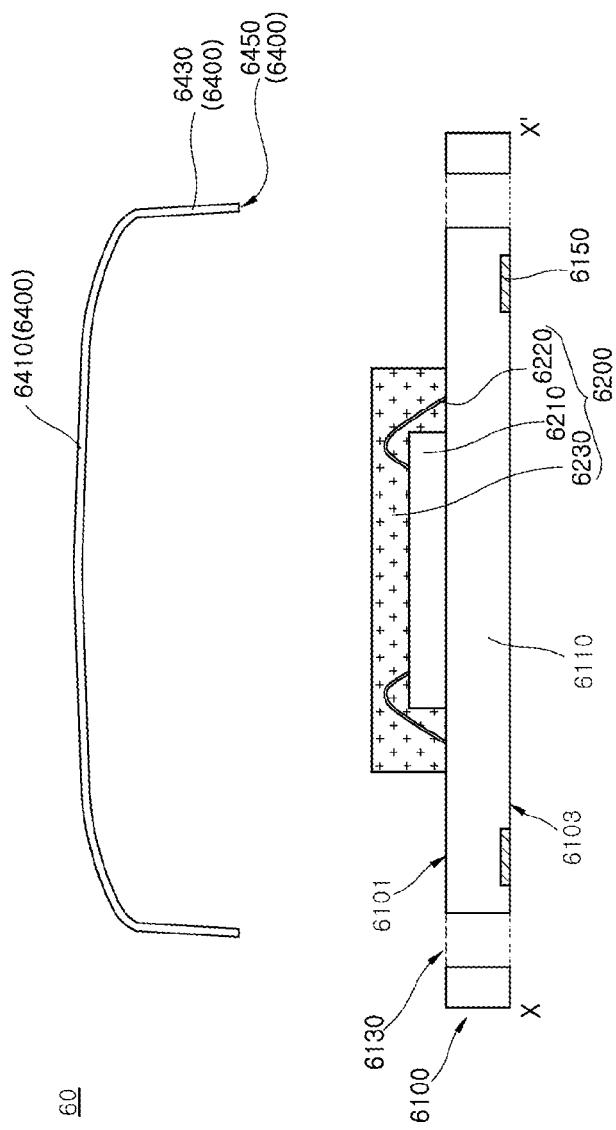
FIGS. 12 to 14 are cross-sectional views illustrating representations of examples of a semiconductor package and a method for manufacturing the same according to an embodiment.
Figure 13:
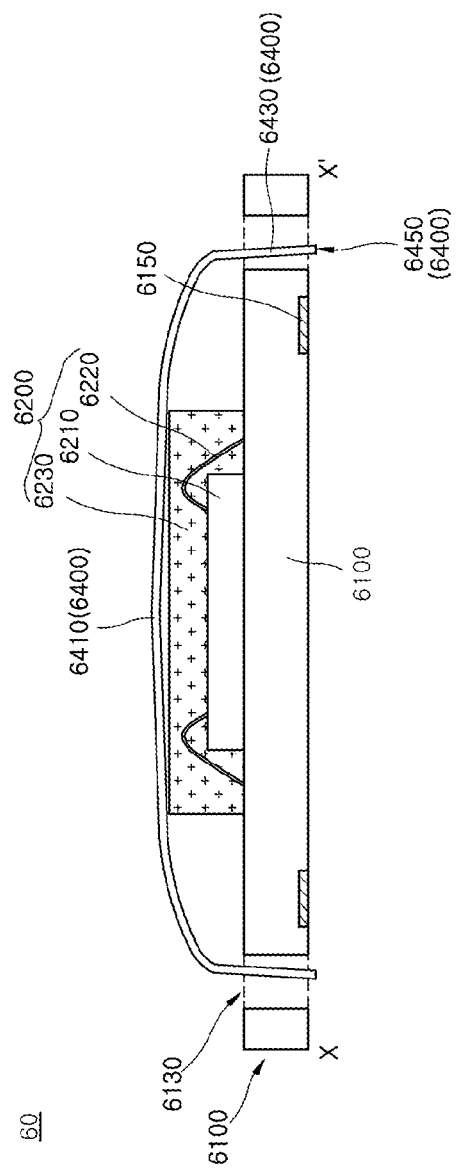
Figure 14:
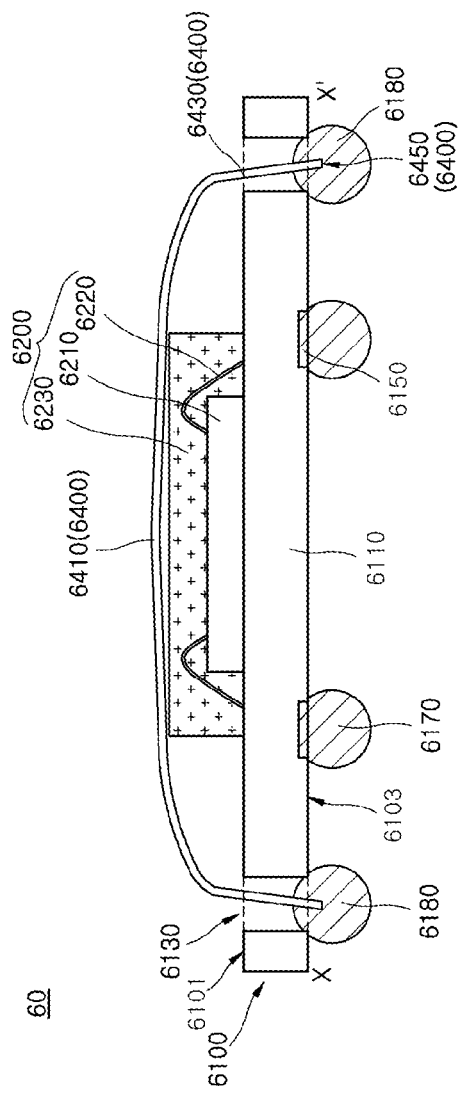

FIGS. 12 to 14 illustrate a semiconductor package 60 and a method for manufacturing the same according to an embodiment.

Referring to FIG. 12, the semiconductor package 60 includes a package substrate 6100 and a conductive elastic plate 6400. The package substrate 6100 includes a chip mounting region 6110 and through slits 6130. The through slit 6130 of the package substrate 6100 may be formed to have a hole shape or a groove shape penetrating a body of the package substrate 6100 like the through slit (130 of FIG. 1) illustrated in FIG. 1. The package substrate 6100 does not include a conductive guard rails (300 of FIG. 1) unlike the package substrate (100 of FIG. 1) in FIG. 1. The through slit 6130 may be formed to penetrate the package substrate 6100 from the first surface 6101 to the second surface 6103.

A semiconductor device 6200 may be mounted on the package substrate 6100 by mounting a semiconductor chip 6210 on the first surface 6101 of the package substrate 6100 and forming connecting members 6220 by a wire bonding process, and forming an encapsulant layer 6230 covering and protecting the semiconductor chip 6210. Connecting pads 6150 are provided on the second surface 6103 of the package substrate 6100.

The conductive elastic plate 6400 including a ceiling portion 6410, wing portions 6430 and edge portions 6450 may be arranged over the package substrate 6100, as illustrated in FIG. 12. An EMI shielding cage feature may be formed by bending the wing portions 6430 of the conductive elastic plate 6400, as illustrated in FIG. 13, the edge portions 6450 of the wing portions 6430 are inserted into the through slits 6130 and may be protruded from the second surface 6103 through the first surface 6101 of the package substrate 6100.

The conductive elastic plate 6400 may be provided in a substantially flat panel shape like the conductive elastic plate (400) of FIG. 1. Both wing portions 6430 are bent, and a part of the wing portions 6430 and the edge portion 6450 can be inserted into the through slits 6130. Alternatively, the conductive elastic plate 6400 may be pre-formed so that the wing portions 6430 and the edge portions 6450 of the wing portions 6430 are bent to face the first surface 6101 of the package substrate 6100, as the conductive elastic plate (3400) of FIG. 7. Afterward, the pre-formed conductive elastic plate 6400 is provided over the package substrate 6100, and the bent wing portions 6430 are bent again and a part of the wing portions 6430 and the edge portion 6450 are inserted into the through slits 6130. In such a case, the additional secondary bending may be omitted.

Referring to FIG. 14, in order to fix the conductive elastic late 6400 to the package substrate 6100, the edge portions 6450 of the conductive elastic plate 6400, which are protruded onto the second surface 6103 of the package substrate 6100, are secured to the second surface 6103 of the package substrate 6100 by ground terminals 6180. The edge portions 6450 of the conductive elastic plate 6400 are inserted into solder portions of the ground terminals 6180, and the solder portions of the ground terminals 6180, which surround the edge portions 6450 of the conductive elastic plate 6400, may be attached to the second surface 6103 of the package substrate 6100 by soldering. In this way, the conductive elastic plate 6400 may be attached and fixed to the package substrate 6100. Connecting terminals 6170 are attached to connecting pads 6150 disposed on the second surface 6103 of the package substrate 6100. The semiconductor package 60 may be applied to embodiments or methods described with reference to FIGS. 1 to 11, except the conductive guard rails (300 of FIG. 1).

Figure 15:
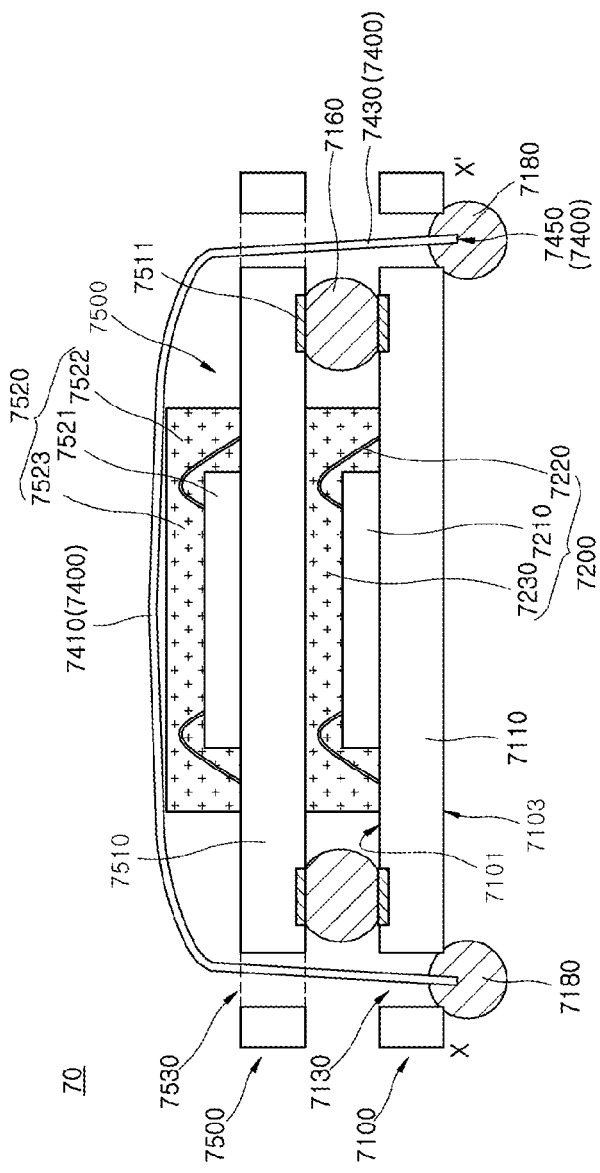
FIG. 15 is a cross-sectional view illustrating a representation of an example of a semiconductor package and a method for manufacturing the same according to an embodiment.

FIG. 15 illustrates a semiconductor package 70 and a method for manufacturing the same according to an embodiment.

Referring to FIG. 15, similar to the semiconductor package (20 of FIG. 6) illustrated in FIG. 6, the semiconductor package 70 may be configured as a package on package (POP) structure including a lower package substrate 7100, a lower semiconductor device 7200, and an upper semiconductor chip package 7500. The lower package substrate 7100 and the upper semiconductor chip package 7500 may be electrically connected to each other by substrate connecting members 7160. The substrate connecting member 7160 may include a conductive bump or a solder ball.

The lower package substrate 7100 may include a chip mounting region 7110 and lower through slits 7130. The through slit 7130 of the lower package substrate 7100 may be formed in a hole shape or a groove shape, which penetrates the body of the package substrate 7100 like the through slits (130 of FIG. 1) illustrated in FIG. 1. The lower package substrate 7100 may be formed to penetrate the lower package substrate 7100 from a first surface 7101 to a second surface 7103.

The lower semiconductor device 7200 may be mounted on the first surface 7101 of the lower package substrate 7100 by mounting the lower semiconductor chip 7210 on the first surface 7101 of the lower package substrate 7100 and forming first connecting members 7220 by a wire bonding process, and forming a first encapsulant layer 7230 to cover and protect the lower semiconductor chip 7210.

The upper semiconductor chip package 7500 in which the upper semiconductor device 7529 is mounted may be prepared by mounting the upper semiconductor chip 7521 on the upper package substrate 7510 and forming a second connecting members 7522 using a wire bonding process, and forming a second encapsulant layer 7523. The upper semiconductor chip package 7500 is laminate on the lower package substrate 7100, therefore, a POP structure is formed. In such a case, the upper through slits 7530 may be provided at edge portions of the upper package substrate 7510. The upper through slits 7530 may be provided to be overlapped with or to be arranged to the lower through slits 7130, respectively.

The conductive elastic plate 7400 including a ceiling portion 7410, wing portion 7430 and edge portions 7450 is provided over the POP structure. An EMI shielding cage is formed by bending the wing portions 7430 of the conductive elastic plate 7400. The edge portions 7450 of the wing portions 7430 pass through the upper and lower through slits 7530 and 7130 and protrude onto the second surface 7103 of the lower package substrate 7100.

The conductive elastic plate 7400 may be provided in a substantially flat panel shape like the conductive elastic plate (400) of FIG. 1. The wing portions 7430 of the both sides are bent and a part of the wing portions 7430 and the edge portions 7450 may be inserted into the lower through slits 7130. Alternatively, the conductive elastic plate 7400 may be pre-formed such that the wing portions 7430 and the end edge portions 7450 of the wing portions 7430 are primarily bent toward the first surface 7101 of the package substrate 7100. Then, the pre-formed conductive elastic plate 7400 is provided over the lower package substrate 7100, and the bent wing portions 7430 are secondarily bent. Then, a part of the wing portions 7430 and the edge portions 7450 are inserted into the lower through slits 7130. In some cases, the additional secondary bending may be omitted.

In order to fix the conductive elastic plate 7400 to the lower package substrate 7100, the edge portions 7450 of the conductive elastic plate 7400, which are protruded from the second surface 7103 of the package substrate 7100, may be secured to the second surface 7103 of the package substrate 7100 by the ground terminals 7180. The semiconductor package 70 may be applied to the embodiments or methods described with reference to FIGS. 1 to 11, except the conductive guard rails (300 of FIG. 1).

Figure 16:
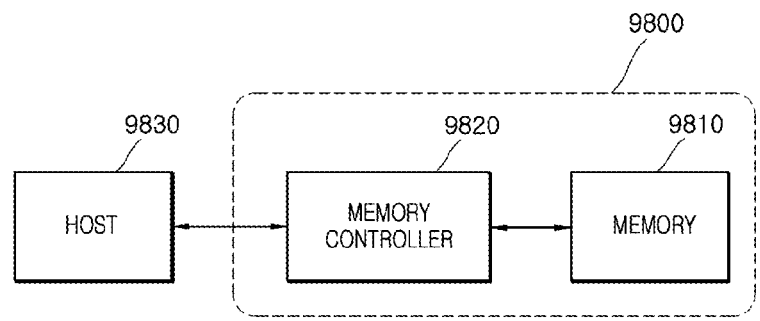
FIG. 16 is a block diagram illustrating a representation of an example of an electronic system employing a memory card including a package according to an embodiment.

FIG. 16 is a block diagram illustrating an electronic system including a memory card 9800 including at least one semiconductor package according to an embodiment. The memory card 9800 includes a memory 9810, such as a nonvolatile memory device, and a memory controller 9820. The memory 9810 and the memory controller 9820 may store data or read stored data. The memory 9810 and/or the memory controller 9820 include one or more semiconductor chips disposed in an embedded package according to an embodiment.

The memory 9810 may include a nonvolatile memory device to which the technology of the embodiments (i.e., see FIGS. 1-15 and related descriptions) is applied. The memory controller 9820 may control the memory 9810 such that stored data is read out or data is stored in response to a read/write request from a host 9830.

Figure 17:
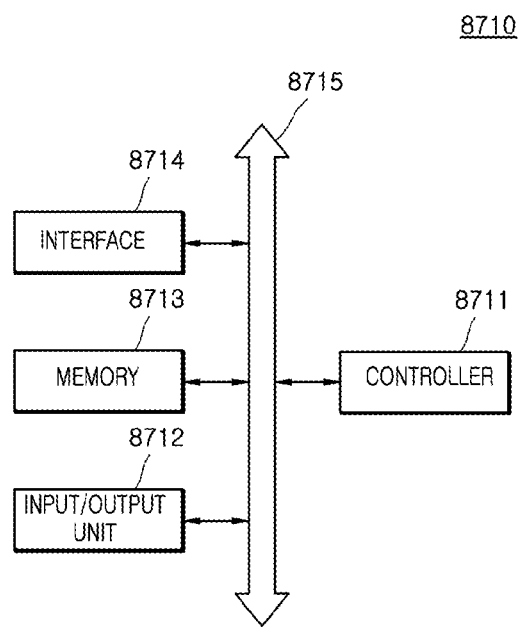
FIG. 17 is a block diagram illustrating a representation of an example of an electronic system including a package according to an embodiment.

FIG. 17 is a block diagram illustrating an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A semiconductor package comprising:
   a package substrate including a chip mounting region, through slits disposed along an edge of the chip mounting region, and conductive guard rails disposed in the through slits and providing concave trenches;
   a semiconductor chip mounted on the chip mounting region; and
   an electromagnetic interference (EMI) shielding cage including a conductive elastic plate including a ceiling portion of the center and wing portions extended from the ceiling portion,
   wherein the wing portions of the conductive elastic plate are elastically bent and form a cage shape having the semiconductor chip therein, and
   wherein edge portions of the wing portions are inserted into the trenches of the conductive guard rails and supported by the conductive guard rails by a force trying to stretch by an elastic restoring force of the wing portions of the conductive elastic plate.

2. The semiconductor package of claim 1,
   wherein the ceiling portion of the conductive elastic plate includes a substantially square area, and
   wherein the wing portions include portions extended from four sides of the substantially square area and spaced apart from each other.

3. The semiconductor package of claim 2,
   wherein the chip mounting region is a substantially square area corresponding to the ceiling portion of the conductive elastic plate, and
   wherein the through slits are located at the four sides of the substantially square area and penetrate the package substrate from top to bottom.

4. The semiconductor package of claim 1, wherein the conductive guard rails fill the through slits so that the inlet of the trench shape faces the conductive elastic plate.

5. The semiconductor package of claim 1, further comprises ground terminals connected to the conductive guard rails.

6. The semiconductor package of claim 1, further comprises an encapsulant layer covering the semiconductor chip.

7. The semiconductor package of claim 6, wherein the conductive elastic plate is located so that a bottom surface the conductive elastic plate contacts a top surface of the encapsulant layer.

8. The semiconductor package of claim 6, wherein the encapsulant layer comprises a flexible dielectric material.

9. The semiconductor package of claim 1, wherein the package substrate comprises a flexible substrate.

10. The semiconductor package of claim 1, further comprises an encapsulant layer covering the semiconductor chip and the conductive elastic plate.

11. A semiconductor package comprising:
    a package substrate including a chip mounting region, at least two trenches along at least two edges of the chip mounting region;
    a conductive elastic plate including a ceiling portion and at least two edge portions extending from the ceiling portion; and
    an upper package substrate located over the package substrate and including upper through slits configured to allow the edges of the conductive elastic plate to pass through the upper package substrate,
    wherein the at least two edge portions are inserted into the trenches.

12. The semiconductor package of claim 11,
    wherein the edge portions inserted into the trenches contact inner side walls of the trenches with an elastic restoring force to maintain contact with the inner side walls of the trenches.

13. The semiconductor package of claim 12,
    wherein the conductive elastic plate is fixed to the package substrate only by the elastic restoring force.

14. The semiconductor package of claim 11, further comprising:
    a semiconductor device mounted on the chip mounting region,
    wherein the semiconductor device is shielded in the lateral direction and an upper surface direction by the conductive elastic plate.

15. The semiconductor package of claim 14, further comprising:
    an encapsulant layer formed over the semiconductor device,
    wherein a bottom surface of the conductive elastic plate facing the encapsulant layer contacts a top surface of the encapsulant layer facing the bottom surface of the conductive elastic plate.

16. The semiconductor package of claim 11,
    wherein the conductive elastic plate shields electromagnetic interference (EMI).

17. The semiconductor package of claim 11,
    wherein the trenches are formed by conductive guard rails disposed in the package substrate,
    wherein the package substrate includes a first surface facing the conductive elastic plate and a second surface opposite the first surface, and
    wherein the conductive guard rails penetrate the package substrate and are exposed to the second surface of the package substrate on which ground terminals are connected.

18. The semiconductor package of claim 11,
    wherein the package substrate includes a first surface facing the conductive elastic plate and a second surface opposite the first surface, and
    wherein the edges of the conductive elastic plate protrude from the second surface and are secured to the second surface of the package substrate through ground terminals.

* * * * *